(12) United States Patent
Wang et al.

(10) Patent No.: US 7,363,963 B2
(45) Date of Patent: Apr. 29, 2008

(54) HEAT DISSIPATION DEVICE

(75) Inventors: Dong Wang, Shenzhen (CN); Tsung-Lung Lee, Tu-Cheng (TW); Li He, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 391 days.

(21) Appl. No.: 11/166,487

(22) Filed: Jun. 24, 2005

(65) Prior Publication Data
US 2006/0137861 A1 Jun. 29, 2006

(30) Foreign Application Priority Data
Dec. 24, 2004 (CN) .................. 2004 2 0103465 U

(51) Int. Cl.
*H05K 7/20* (2006.01)
(52) U.S. Cl. .................. 165/80.3; 165/104.33; 165/126
(58) Field of Classification Search ............... 165/80.2, 165/80.3, 124, 126, 104.33; 361/697, 700
See application file for complete search history.

(56) References Cited

U.S. PATENT DOCUMENTS

| | | | | |
|---|---|---|---|---|
| 5,975,194 A | * | 11/1999 | Wagner | ............. 165/80.3 |
| 6,382,306 B1 | * | 5/2002 | Hsu | ............. 165/80.3 |
| 6,450,251 B1 | | 9/2002 | Lin et al. | |
| 6,538,888 B1 | | 3/2003 | Wei et al. | |
| 2003/0192670 A1 | * | 10/2003 | North et al. | ............. 165/80.3 |

FOREIGN PATENT DOCUMENTS

| TW | 495133 | 7/2002 |
|---|---|---|
| TW | 532758 | 5/2003 |

* cited by examiner

*Primary Examiner*—Teresa J. Walberg
(74) *Attorney, Agent, or Firm*—Morris Manning Martin LLP; Tim Tingkang Xia, Esq.

(57) ABSTRACT

A heat dissipation device for electronic devices on a substrate comprises a base contacting one of the electronic devices for absorbing heat therefrom. A plurality of fins arranged on the base for dissipating heat. A plurality of airflow channels is defined between the fins, and each channel defines an intake and an outlet. A fan is located adjacent to the intakes and provides airflow entering the channels through the intakes and leaving the channels through the outlets. A first guiding member is located adjacent to the outlets. The airflow out of the outlets is guided, by the first guiding member, to be deflected towards the substrate for cooling other electronic devices neighboring the one contacting with the base.

20 Claims, 6 Drawing Sheets

HEAT DISSIPATION DEVICE

BACKGROUND OF THE INVENTION

1. Field of the Invention

The present invention relates generally to heat dissipation devices, and more particularly to heat dissipation devices for cooling electronic devices on a substrate.

2. Description of Related Art

Developments in integrated circuits technology have led to remarkable improvements of performances of electronic devices. Integrated circuit devices, microprocessors and other related computer components are becoming more and more powerful with increasing capabilities, resulting in increasing amounts of heat generated by these components. Such heat must be efficiently dissipated out from the electronic devices, to prevent them from becoming unstable or being damaged. Typically, a heat sink is attached to an outer surface of the electronic device to facilitate dissipation of heat therefrom.

A typical conventional heat sink is disclosed in TW Patent issue No. 532758. In this disclosure, the heat sink comprises a base plate for contacting a central process unit (CPU) to absorb heat, and a plurality of parallel fins arranged perpendicularly on a top surface of the base plate for dissipating heat. For strengthening heat dissipation of the fins, a fan is mounted to the heat sink for providing a forced airflow which can accelerate heat exchange between the fins and environment. Normally, there is a gradual temperature increase from free end of each fin to its root and further to the base plate. Most heat is accumulated on the base plate, and heat dissipation performance of the heat sink is limited.

On the other hand, a computer system is becoming complexer, electronic components included in the computer system, generally mounted on a substrate such as printed circuit board, are more and more. Density of electronic components around the CPU remarkably increases. Likewise, These components also generate considerable heat. That impacts negatively on operation of the CPU and the whole computer system. In order to minimize the impact, the electronic components around the CPU also need cooling for ensuring that the performance of the whole computer system is not depressed due to temperature increase.

Therefore, an improved heat dissipation device which overcomes above problems is desired.

SUMMARY OF THE INVENTION

Accordingly, what is needed is to provide a heat dissipation device with a high heat dissipation capability for cooling a heat-generating electronic device and also cooling neighboring electronic components.

A heat dissipation device of a preferred embodiment comprises a heat-absorbing base for contacting an electronic component on a substrate and a plurality of fins arranged on the base. A plurality of airflow channels is defined between the fins and each channel defines an intake and an outlet. A fan is located adjacent to the intakes of the channels and providing airflow entering the channels through the intakes and leaving the channels through the outlets. A first guiding member is located adjacent to the outlets of the channels. The airflow out of the channels through the outlets is guided, by the first guiding member, to flow toward the substrate for cooling other electronic components adjacent to the electronic component. The heat dissipation device includes a second guiding member formed by a fan holder for mounting the fan. The second guiding member is located beside the intakes and used for guiding a portion of the airflow generated by the fan to be directed downwardly to cool an electronic component near the intakes of the channels.

Other advantages and novel features of the present invention will be drawn from the following detailed description of some embodiments of the present invention together with the attached drawings, in which:

DETAILED DESCRIPTION OF THE PREFERRED EMBODIMENTS

Figure 1:
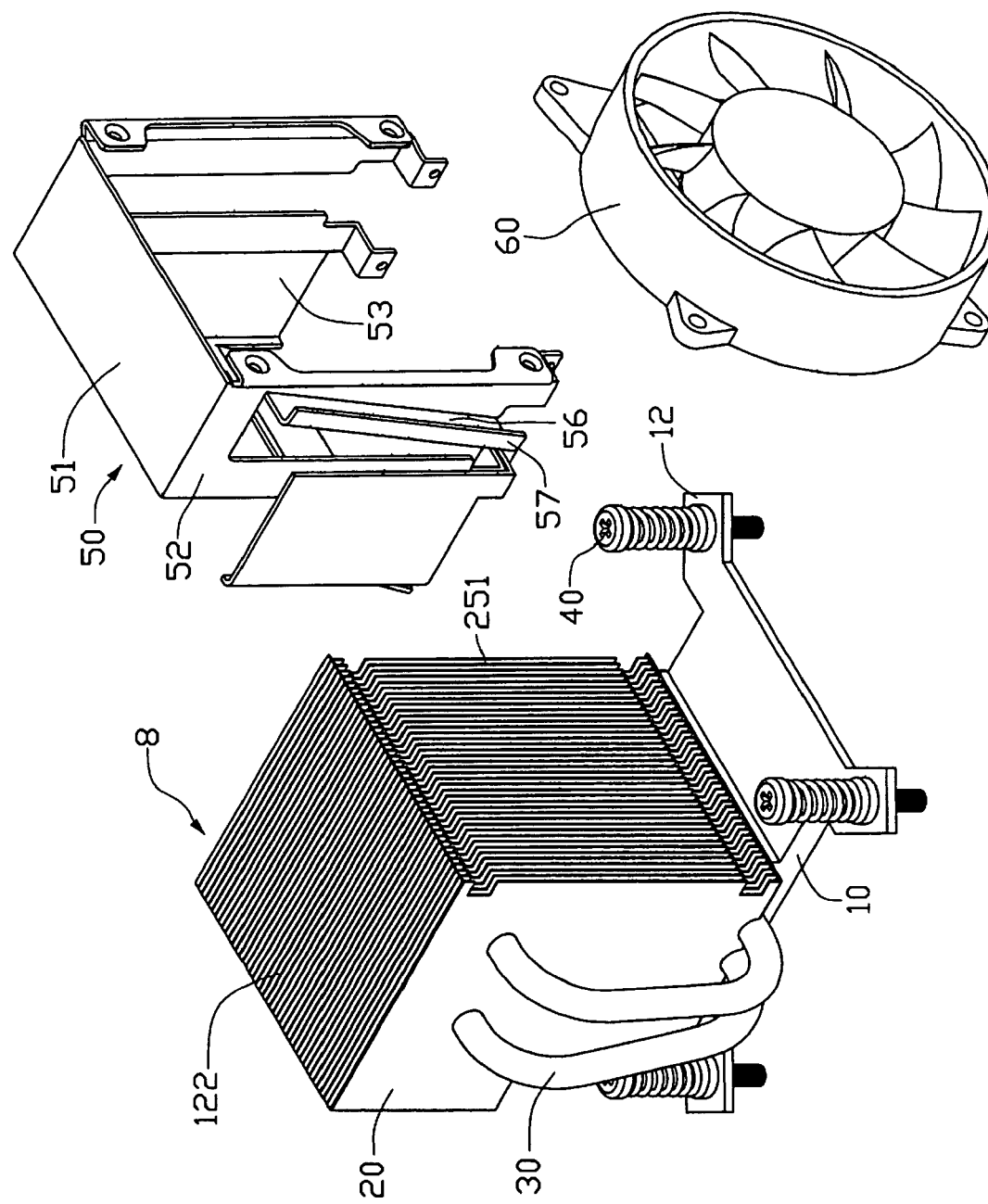
FIG. 1 is a partly exploded view of a heat dissipation device of a preferred embodiment in accordance with the present invention.
Figure 2:
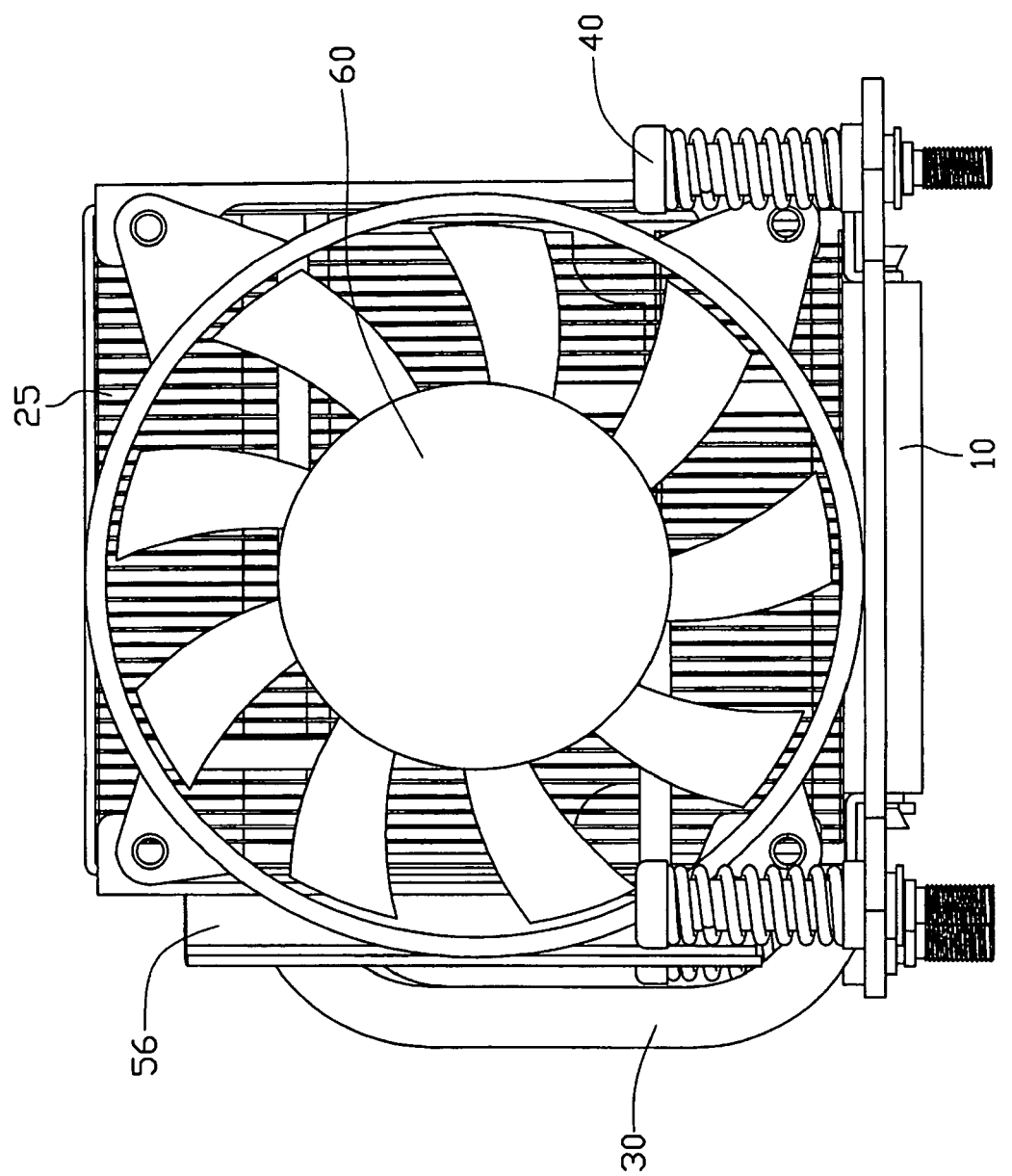
FIG. 2 is a front assembled view of FIG. 1.
Figure 3:
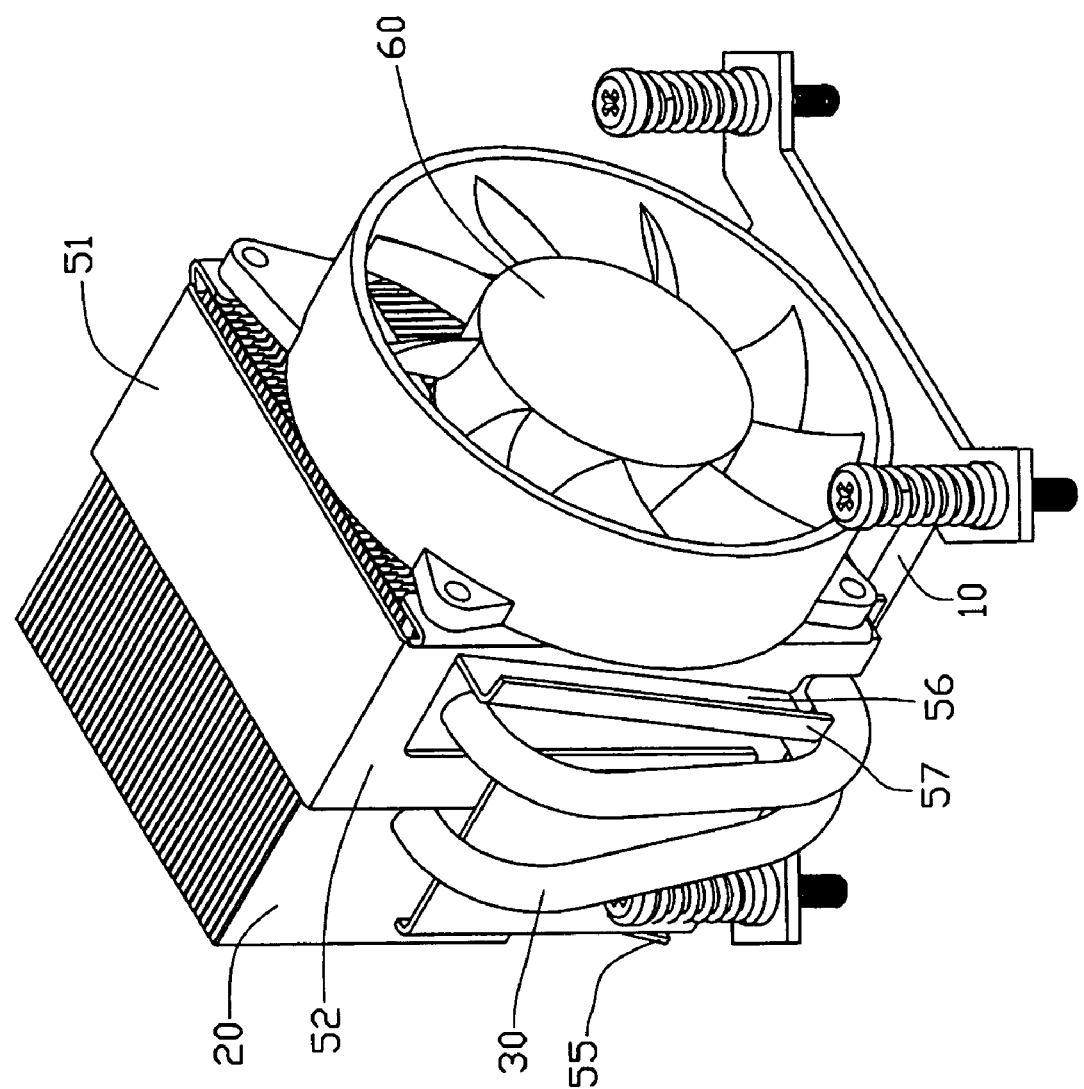
FIG. 3 is a perspective assembled view of FIG. 1 from a front aspect.
Figure 4:
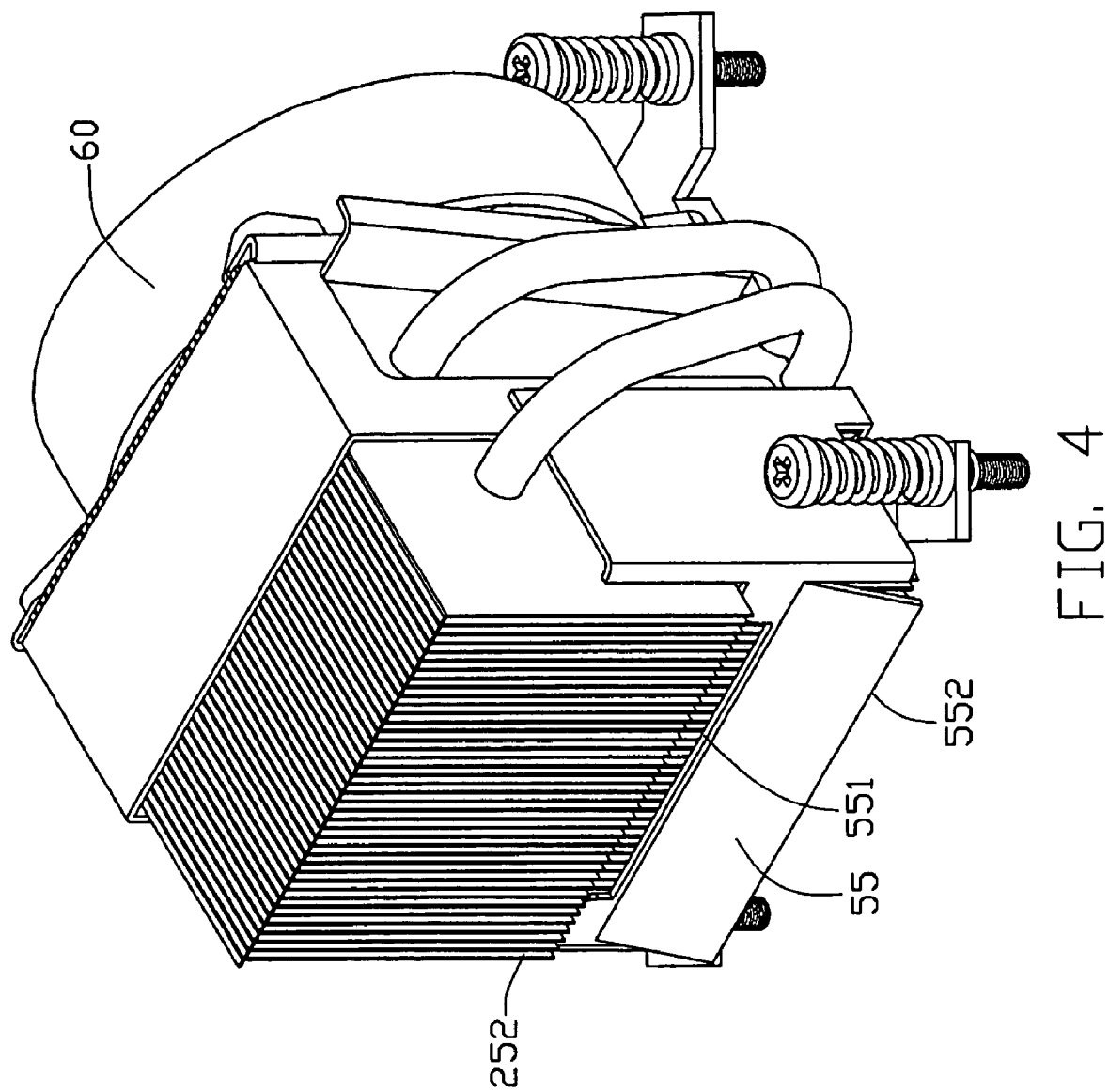
FIG. 4 is a similar FIG. 1 but from a rear aspect.

In the following detailed description of the embodiments, reference is made to the accompanying drawings that illustrate embodiments of the present invention and its practices.

FIGS. 1 to 4 show a heat dissipation device of a preferred embodiment in accordance with the present invention. The heat dissipation device is for being mounted to a substrate, generally being a printed circuit board (not shown), to contact an electronic device, such as CPU (not shown), for heat dissipation.

The heat dissipation device comprises a heat sink 8. The heat sink 8 comprises a substantially rectangular heat-absorbing base 10 for contacting the CPU. Four fixing arms 12 extend outwardly from four corners of the base 10. Each fixing arm 12 defines a hole (not shown) in which a fastener 40 is received for fixing the heat dissipation device to the printed circuit board. A plurality of rectangular fins 20, parallel to each other, is perpendicularly arranged on a top surface of the base 10 at intervals. Each fin 20 forms a first folded edge (not shown) soldered to the base 10 for facilitating heat conduction from the base 10 to the fin 20, and a second folded edge 22 opposite to the first folded edge for spacing the fin 20 from an adjacent fin 20. A plurality of channels 25 is formed between the fins 20. Each channel 25 is encircled by two adjacent fins 20, the first folded edge and the second folded edge 22 of one of the two fins 20 and defines an intake 251 and an outlet 252 opposite to the intake 251. For facilitating heat transferring from the base 10 to the fins 20, two U-shaped heat pipes 30 are provided. One end of each heat pipe 30 is attached to the base 10, and the other end extends away from the base 10 and through the fins 20. Part of heat absorbed by the base 10 from the CPU is transferred to a bottom of the fins 20 and conducted upwardly along the fins 20, and the rest of the heat is transferred to the fins 20 by heat pipes 30.

The heat dissipation device further comprises a fan holder 50 mounted to the heat sink 8. The fan holder 50 is for mounting a fan 60 to the heat dissipation device. The fan holder 50 includes a top wall 51 above the fins 20, and two opposite sidewalls 52,53 which depend from opposite edges of the top wall 51, accommodate the fins 20 therebetween and are fixed to the base 10. A first guiding member 55 connects with the two sidewalls 52, 53 of the fan holder 50 and is located adjacent to the outlets 252 of the channels 25. The first guiding member 55 extends along a direction transverse a lower portion of the outlets 252 of the channels 25. The first guiding member 55 is so constructed that it is inclined relative to a rear side of the fins 20 and the base 10. The first guiding member 55 is inclined in a direction that a top edge 551 thereof is close to the fins 20 and a bottom edge 552 thereof is distant from the fins 20.

A second guiding member 56 is formed on the sidewall 52 of the fan holder 50 and extends substantially parallel to the first guiding member 55. A baffle 57 extends substantially perpendicularly from an outer edge of the second guiding member 56 for minimizing an airflow generated by the fan 60 and flowing to the second guiding member 56 to flow laterally away from the second guiding member 56, whereby most of the airflow can be guided by the second guiding member 56 to flow inclinedly downwards and rearwards therealong.

The fan 60 is fastened to a front side of the fan holder 50 by extending screws (not shown) through holes (not labeled) defined in the fan 60 into screw holes (not labeled) defined in the fan holder 50. The fan 60 offsets laterally relative to fins 20 in a direction to be located closer to the second guiding member 56 so that the airflow generated by the fan 60 simultaneously flows through the channels 25 and reachs the second guiding member 55. One part of the airflow provided by the fan 60 enters the channels 25 through the intakes 251 and flow out through the outlets 252. The airflow out of the channel 25 is guided by the first guiding member 55 to be directed inclinedly downwards and rearwards towards the printed circuit board, then flows upon the printed circuit board and pass through electronic components (not shown) on the printed circuit board and neighboring the CPU to cool them. The other part of the airflow hits the second guiding member 56, instead of entering the channels 25, and is guided by the second guiding member 56 to flow towards the printed circuit board thereby cooling other electronic components on the printed circuit board and neighboring the CPU and the intakes 251 of the channels 25. Due to the guiding action of the first guiding member 55 and the second guiding member 56, more electronic components in addition to the CPU can be cooled by the heat dissipation device in accordance with the present invention. Furthermore, a part of the airflow guided by the first and second guiding members 55, 56 to impact on the printed circuit board can flow through the base 10 and a connection between the fins 20 and the base 10, which is the hottest spot of the device to take heat away therefrom, whereby the heat dissipation efficiency by the present invention can be enhanced. As a result, heat dissipation performance of the heat dissipation device is improved. The heat dissipation device can cool effectively the CPU and the neighboring electronic components around the CPU on the substrate.

Figure 5:
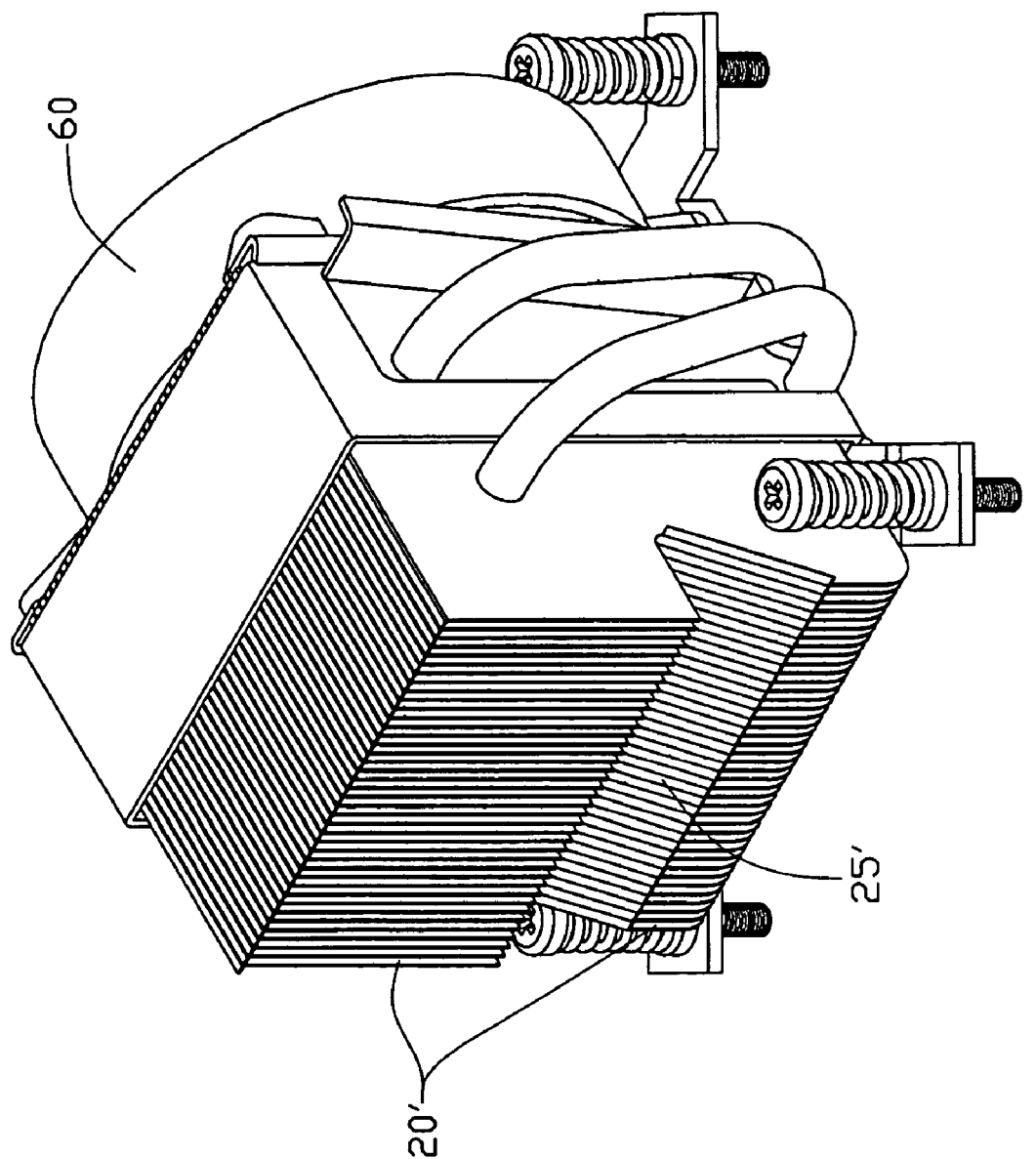
FIG. 5 is a perspective assembled view of a second embodiment in accordance with the present invention from a rear aspect.
Figure 6:
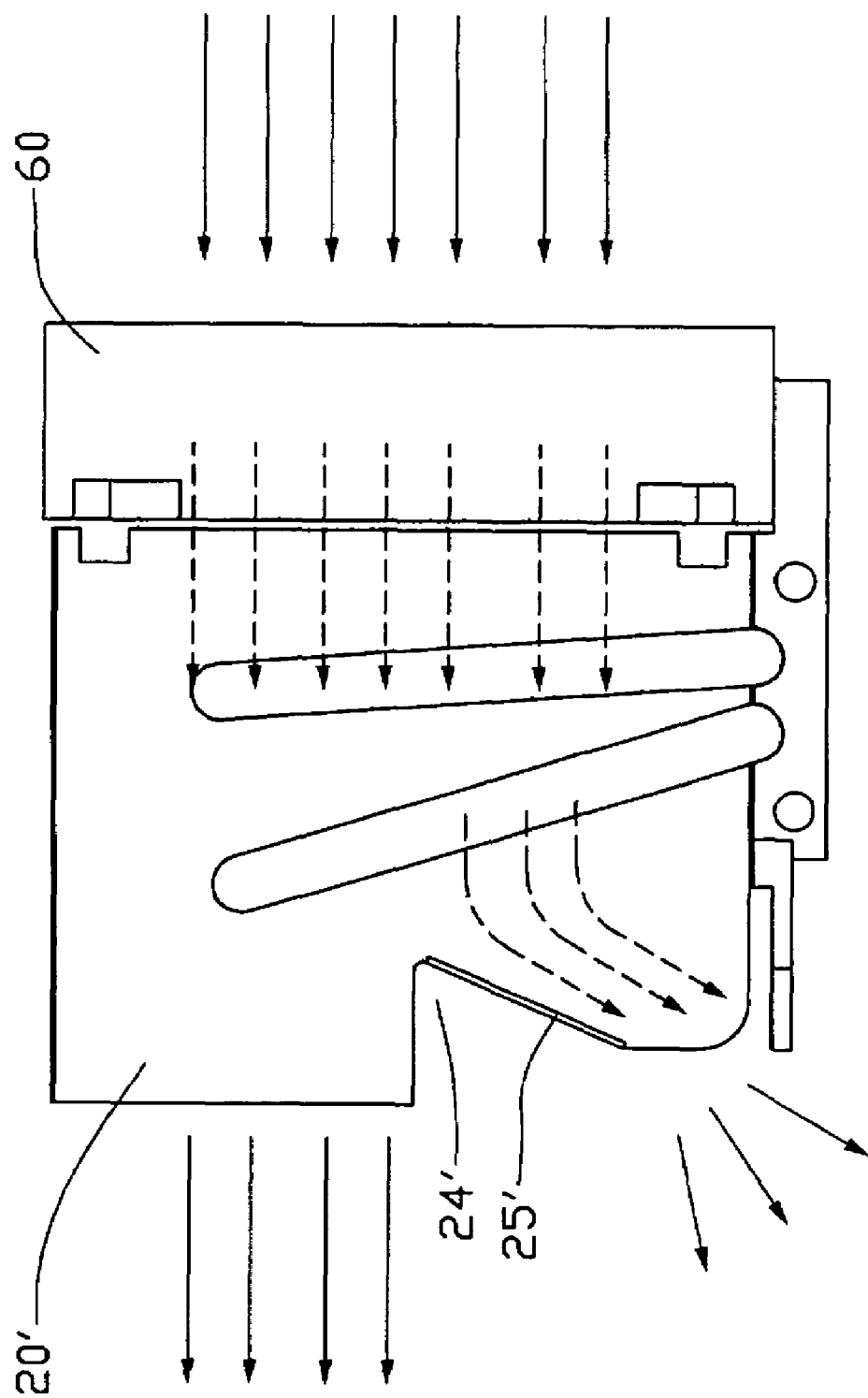
FIG. 6 is a side view of FIG. 5 with arrows indicating airflow directions through the heat dissipation device.

As a varied practice of the present invention, a second embodiment of the present invention is illustrated in FIG. 5. Similar to the first embodiment, a heat sink comprises a base (not labeled) and a plurality of fins 20' arranged on the base, a plurality of channels (not labeled) with intakes and outlets formed between the fins 20'. Similarly, a fan 60 is fastened to the heat sink and provides an airflow entering the channels. Each fin 20' defines a triangle cutout 24' at the outlet thereby forming an inclined portion for the outlets. The inclined portion is coincident with an inclined side of the triangle cutout 24'. A folded flange 25' is formed by each fin 20' at the inclined portion of the outlets. The flanges 25' connect with each other to block the inclined portion of the outlets. As shown in FIG. 6, one part of the airflow generated by the fan 60 is blocked and then guided by the flanges 25' to flow inclinedly downwards and rearwards toward the printed circuit board at a place neighboring where the CPU is located. Therefore, an electronic component (for example, a voltage regulating module (VRM)) can also be cooled by the heat dissipation device.

From above description of the present invention, it is obvious that the first and second guiding members are not limited to be formed on the fan holder or the fins, they can be formed in other manners, so long as being able to direct airflow toward the substrate on which the heat dissipation device is mounted.

It is recognized that the invention may be susceptible to various other modifications and alternative constructions in view of this disclosure. Although the invention has been shown and described in detail herein by a preferred embodiment and certain alternatives, it should be understood that there is no intention of limiting the invention strictly to this. But rather it is the intention to cover all such other modifications and alternative constructions falling within the spirit and scope of the invention as defined in the appended claims.

We claim:

1. A heat dissipation device comprising:
   a base;
   a plurality of fins arranged on the base, a plurality of airflow channels formed between the fins, each channel defining a front intake and a rear outlet; and
   a first guiding member located adjacent to the outlets of the channels and extending in a direction inclinedly downwardly away from the intakes of the channels, and inclined relative to the base, the guiding member is used for guiding a part of an airflow to flow inclinedly downwards and rearwards after the part of the airflow enters the channels via the intakes and leaves the channels via the outlets;
   wherein the first guiding member extends transverse to the outlets of the airflow channels.

2. The heat dissipation device as described in claim 1, wherein the first guiding member is an inclined plate extending transverse to the outlets.

3. The heat dissipation device as described in claim 2, further comprising a fan located near the intakes of the channels.

4. The heat dissipation device as described in claim 3, further comprising a fan holder on which the fan is mounted, the fan holder comprising a top wall above the fins and two sidewalls depending from the top wall, and the first guiding member connects with the sidewalls.

5. The heat dissipation device as described in claim 4, further comprising a second guiding member substantially parallel to the first guiding member, located beside the intakes of the channels, and used for guiding another part of the airflow to flow downwardly.

6. The heat dissipation device as described in claim 5, wherein the second guiding member is an inclined plate formed on one of the sidewalls of the fan holder.

7. The heat dissipation device as described in claim 6, wherein the second guiding member has a baffle perpendicularly projecting from an outer edge of the second guiding member.

8. The heat dissipation device as described in claim 1, wherein the first guiding member consists of a plurality of folded flanges formed by the fins, the folded flanges connecting with each other.

9. The heat dissipation device as described in claim 8, wherein each of the fins defines a triangle cutout, and each of the folded flanges extends on an inclined side of the triangle cutout.

10. A heat dissipation device for electronic devices on a substrate comprising:
   a base for contacting one of the electronic devices for absorbing heat;
   a plurality of fins arranged on the base, a plurality of airflow channels formed between the fins, and each channel defining an intake and an outlet;
   a fan located adjacent to the fins and providing an airflow entering the channels through the intakes;
   a first guiding member located adjacent to the outlets;
   wherein the airflow leaving the channels through the outlets is guided, by the first guiding member, towards the substrate for cooling the other electronic devices; and
   wherein the fins are stacked parallel to each other and run on a surface of the base perpendicularly.

11. The heat dissipation device as described in claim 10, wherein the first guiding member comprises at least a first and second point opposing to one of the outlets of the channels, the second point is farther from the intake and nearer to the substrate than the first point.

12. The heat dissipation device as described in claim 11, wherein the first guiding member consists of a plurality of folded flanges formed on the fins and connecting with each other in line.

13. The heat dissipation device as described in claim 11, wherein the first guiding member is an inclined plate transverse to the outlets.

14. The heat dissipation device as described in claim 13, further comprising a fan holder for fastening the fan, and the first guiding member formed on the fan holder.

15. The heat dissipation device as described in claim 14, wherein the fan holder comprises a top wall above the fins, and two sidewalls depending from the top wall and accommodating the fins therebetween.

16. The heat dissipation device as described in claim 15, wherein the first guiding member connects with the two sidewalls of the fan holder.

17. The heat dissipation device as described in claim 10, further comprising a second guiding member located beside the channels and adjacent to the fan for deflecting at least one part of the airflow provided by the fan towards the substrate.

18. The heat dissipation device as described in claim 17, wherein the second guiding member is an inclined plate extending from one of sidewalls of the fan holder.

19. A heat dissipation device for electronic devices on a substrate comprising:
   a base for contacting one of the electronic devices for absorbing heat;
   a plurality of fins arranged on the base, a plurality of airflow channels formed between the fins, and each channel defining an intake and an outlet;
   a fan located adjacent to the fins and providing an airflow entering the channels through the intakes;
   a first guiding member located adjacent to the outlets; and
   a second guiding member located beside the channels and adjacent to the fan for deflecting at least one part of the airflow provided by the fan towards the substrate;
   wherein the airflow leaving the channels through the outlets is guided, by the first guiding member, towards the substrate for cooling the other electronic devices.

20. The heat dissipation device as described in claim 19, wherein the second guiding member is an inclined plate extending from one of sidewalls of the fan holder.

* * * * *